US006677638B2

United States Patent
Choi et al.

(10) Patent No.: US 6,677,638 B2
(45) Date of Patent: Jan. 13, 2004

(54) NONVOLATILE MEMORY DEVICE AND METHOD FOR FABRICATING THE SAME

(75) Inventors: Jae Seung Choi, Seoul (KR); Sang Bae Yi, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 10/139,821

(22) Filed: May 7, 2002

(65) Prior Publication Data

US 2002/0132410 A1 Sep. 19, 2002

Related U.S. Application Data

(62) Division of application No. 09/710,954, filed on Nov. 14, 2000, now Pat. No. 6,410,390.

(30) Foreign Application Priority Data

Feb. 3, 2000 (KR) .......................................... 2000-5379

(51) Int. Cl.[7] ...................... H01L 29/76; H01L 29/788; H01L 29/792; H01L 23/48
(52) U.S. Cl. ...................... 257/314; 257/315; 257/324; 257/774; 257/763; 257/764; 257/770
(58) Field of Search .................................. 257/314, 315, 257/324, 774, 763, 764, 770

(56) References Cited

U.S. PATENT DOCUMENTS

| 5,194,929 A | * | 3/1993 | Ohshima et al. ............ 257/326 |
| 5,350,938 A | * | 9/1994 | Matsukawa et al. ........ 257/378 |
| 5,534,455 A | | 7/1996 | Liu |
| 5,553,018 A | | 9/1996 | Wang et al. |
| 5,592,415 A | * | 1/1997 | Kato et al. ................... 257/315 |
| 5,677,215 A | * | 10/1997 | Goo ........................... 438/257 |

* cited by examiner

Primary Examiner—Jasmine Clark
(74) Attorney, Agent, or Firm—Morgan, Lewis & Bockius LLP

(57) ABSTRACT

Disclosed is a nonvolatile memory device comprising a semiconductor substrate defining first and second active regions arranged in one direction; a first gate insulating layer and a floating gate deposited on the first and second active regions in a predetermined pattern; a second gate insulating layer and a control gate line deposited in one direction perpendicular to the first and second active regions and covering the floating gate; first impurity regions formed in the first and second active regions at one side of the control gate line; second impurity regions formed in the first and second active regions at other side of the control gate line; first contact plugs contacted with the first impurity regions; and a common conductive line formed in one direction on the semiconductor substrate at the other side of the control gate line, for connecting the second impurity regions of the first and second active regions.

11 Claims, 17 Drawing Sheets

NONVOLATILE MEMORY DEVICE AND METHOD FOR FABRICATING THE SAME

This a divisional of allowed copending U.S. application Ser. No. 09/710,954, filed on Nov. 14, 2000 U.S. Pat. No. 6,410,390.

BACKGROUND OF THE INVENTION

1. Field of the Invention

The present invention relates to a semiconductor memory device, and more particularly to a nonvolatile memory device and method for fabricating the same which is capable of reducing the size of a chip and simplifying the process for forming a common source line.

2. Background of the Related Art

In general, semiconductor memory devices are mainly divided into two main groups, i.e., a volatile memory device which is capable of erasing the stored data and then restoring new data, and a nonvolatile memory device which permanently reserves the stored data.

The volatile memory device includes a RAM capable of reading and writing of data and the nonvolatile memory device includes a ROM(Read Only Memory), EPROM (Erasable Programmable ROM) and EEPROM(Electrically Erasable Programmable ROM).

In the nonvolatile memory device, the ROM is not possible to reprogram once it stores the data. The EPROM and EEPROM is possible to erase the stored data and then reprogram. EPROM and EEPROM are the same in operation of programming the data, but different in methods of erasing the stored data. Specifically, the EPROM erases the stored data using ultraviolet and EEPROM erases the stored data electrically.

When a plurality of the nonvolatile memory devices are arranged in a form of matrix, sources of the nonvolatile memory devices can be connected for increasing the integration. Accordingly, methods for connecting sources of the nonvolatile memory devices have been studied.

With reference to the accompanying drawings, a related art nonvolatile memory device and a method for fabricating the same will be described.

FIG. 1 is a plan view showing a cell array of a related art nonvolatile memory device, FIG. 2a is sectional view showing a structure of the related art nonvolatile memory device taken along the line I—I in FIG. 1, and FIG. 2b is a sectional view showing a structure of the related art nonvolatile memory device taken along the line II—II in FIG. 1.

As shown in FIGS. 1, 2a and 2b, the related art nonvolatile memory device includes a semiconductor substrate 10 defining a plurality of active regions and a field region. A field oxide film 11 is formed on the field region. The active regions are aligned in one direction.

A plurality of tunneling oxide films 12 and floating gates 13 are deposited on each of the active regions in a predetermined pattern. Inter-poly dielectric layers 14 and control gate lines 15 are deposited in a direction perpendicular to the active regions to cover the floating gates 13.

The control gate lines are formed to be bent outwardly, because an area for forming a contact wire in a common source ion injection region which is to be formed at a later step requires a greater margin.

The tunneling oxide films 12, floating gates 13, inter-poly dielectric layers 14 and control gate lines 15 are provided with sidewalls 19a at both sides thereof. The sidewalls 19a at the inner sides of the control gate lines 15 in which the common source ion injection region is to be formed are partially removed.

In a state that pairs each consisting of two, i.e., first and second control gate lines 15 are aligned, drain regions are formed in the semiconductor substrate 10 outside of the pairs of the first and second control gate lines 15. Also, a common source ion injection region 21 is formed in the semiconductor substrate 10 between the first and second control gate lines 15.

Referring to FIG. 1, the reference numerals 22 and 23 denote a drain wire and a source wire, respectively. The drain wire 22 is aligned with the active region to connect the drain regions on a same active region. The source wire 23 is aligned with the active region to connect the common source ion injection regions 21.

Referring to FIGS. 3a and 4a, the process for manufacturing the above-explained related art nonvolatile memory device will be described.

A field oxide film 11 is formed on the field region of the semiconductor substrate 10 defining the active regions and the field region. A first oxide film and a first polysilicon layer are deposited in a direction aligned with each active region of the semiconductor substrate 10.

A second oxide film and a second polysilicon layer are successively deposited on the entire surface of the semiconductor substrate 10 using a chemical vapor deposition (CVD). A photo-sensitive film is coated on the second polysilicon layer and then patterned in one direction perpendicular to the active regions. The second polysilicon layer, the second oxide film, the first polysilicon layer and the first oxide film are successively anisotropic-etched, using the patterned photo-sensitive film as a mask.&&

By the above steps, as shown in FIGS. 3a and 4a, the tunneling oxide film 12 and the floating gate 13 are formed on one portion of the active region of the semiconductor substrate 10 in a predetermined pattern. Also, an inter-poly dielectric layer 14 and a control gate line 15 are formed in one direction perpendicular to the active region to cover the floating gate 13. Then, the photo-sensitive film is removed.

Then, as shown in FIGS. 3b and 4b, a first photo-sensitive film 16 is deposited on the entire surface of the semiconductor substrate 10. The first photo-sensitive film 16 is selectively patterned by exposing and developing process, so as to expose a portion of the active region of the semiconductor substrate 10 in which a drain region is to be formed.

First conductive ions are injected into the portion which is to be a drain region, using the patterned first photo-sensitive film as a mask, thereby forming a drain region 18.

By tilt ion injection method, second conductive ions are injected into a bottom portion of the floating gate 13 adjacent to the drain region, to form a halo ion region 17. Then, the first photo-sensitive film 16 is removed.

As shown in FIGS. 3c and 4c, an insulating layer 19 is formed over the entire surface of the semiconductor substrate 10.

As shown in FIGS. 3d and 4d, the insulating layer 19 is anisotropic-etched to form sidewalls 19a at both sides of the tunneling oxide film 12, the floating gate 13, the inter-poly dielectric layer 14 and the control gate line 15.

As shown in FIGS. 3e and 4e, a second photo-sensitive film 20 is coated on the entire surface of the semiconductor substrate 10. Then, the second photo-sensitive film 20 is selectively patterned by exposing and developing process, so as to expose the field oxide film 11 and the active regions between the control gate lines.

The field oxide film 11 and the sidewalls 19a are anisotropic-etched to expose the semiconductor substrate 10 between the control gate lines 15 using the patterned second photo-sensitive film 20 as a mask. At this time, there occurs a problem that the surface of the active region of the semiconductor substrate 10 is etched.

The process for etching the field oxide film 11 using the second photo-sensitive film 20 and sidewall 19a as a mask in order to form a common source ion injection region is referred to as a self-align source dry-etching process.

The first conductive ions are injected into the exposed portion of the semiconductor substrate 10 between the control gate lines 15 to form a common source ion injection region 21 in one direction between the control gate lines 15.

However, the related art nonvolatile memory device and the method for fabricating the same has the following problems.

First, when the field oxide film is removed, i.e., when the self-align source dry-etching process is performed in order to form a common source ion injection region, the semiconductor substrate may be lost to reduce the reliance on the operation of the semiconductor device.

Second, if ions are injected into the lost portion of the semiconductor substrate after the self-align source dry-etching process, it is not easy to control the concentration of the source region.

Third, the sidewalls of the active regions are lost during the self-align source dry-etching process, thus, the control gate lines and the inter-poly dielectric layer may be damaged.

SUMMARY OF THE INVENTION

Accordingly, an object of the present invention is to solve at least the problems and disadvantages of the related art.

Another object of the present invention is to provide a nonvolatile memory device and a method for fabricating the same which is capable of increasing the integration of a semiconductor device, simplifying the process for forming a common source line and improving the reliance on the operation of the device.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, a nonvolatile memory device includes a semiconductor substrate defining first and second active regions arranged in one direction; a first gate insulating layer and a floating gate deposited on the first and second active regions in a predetermined pattern; a second gate insulating layer and a control gate line deposited in one direction perpendicular to the first and second active regions and covering the floating gate; first impurity regions formed in the first and second active regions at one side of the control gate line; second impurity regions formed in the first and second active regions at other side of the control gate line; first contact plugs contacted with the first impurity regions; and a common conductive line formed in one direction on the semiconductor substrate at the other side of the control gate line, for connecting the second impurity regions of the first and second active regions.

A method for fabricating a nonvolatile memory device according to the invention includes the steps of defining first and second active regions to be arranged on a semiconductor substrate in one direction; depositing a first gate insulating layer and a floating gate on the first and second active regions in a predetermined pattern, and depositing a second gate insulating layer and a control gate line in one direction perpendicular to the first and second active regions to cover the floating gate; forming first impurity regions in the first and second active regions at one side of the control gate line; forming second impurity regions in the first and second active regions at other side of the control gate line; forming a buffer insulating layer on the entire surface of the semiconductor substrate including the first and second impurity regions; forming a first interlayer dielectric on the semiconductor substrate such that first contact holes are provided in the first impurity regions and that a line-type contact hole is formed by connecting and exposing the second impurity regions of the first and second active regions; forming a third impurity region by injecting ions into the first and second impurity regions exposed by the first contact holes and the line-type contact hole; removing the buffer insulating layer from the first contact holes and the line-type contact hole; and forming first contact plugs in the first contact holes and forming a common conductive line in the line-type contact hole.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENT

Reference will now be made in detail to the preferred embodiments of the present invention, examples of which are illustrated in the accompanying drawings.

Figure 1:
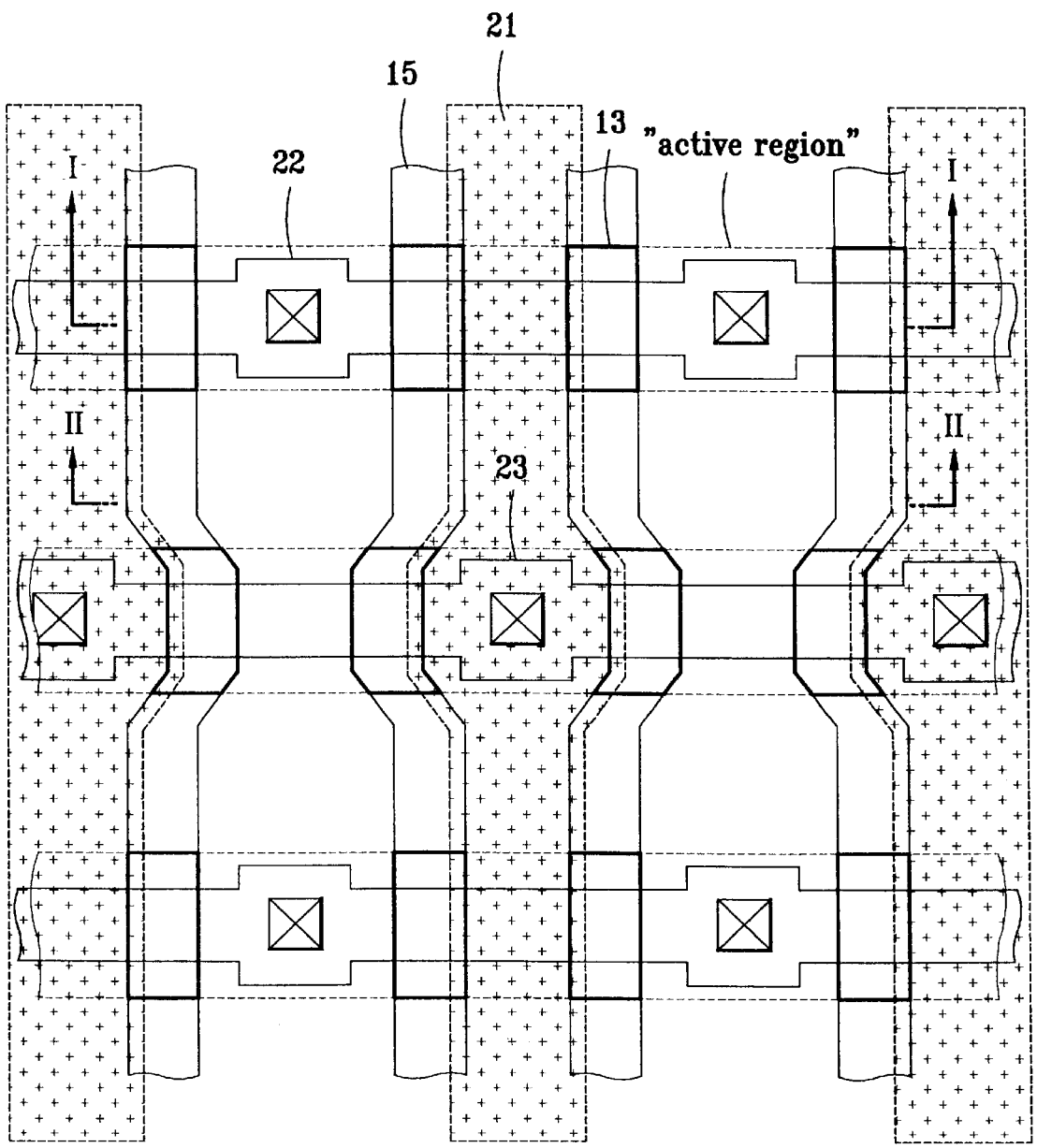
FIG. 1 is a plan view showing a cell array of a related art nonvolatile memory device.
Figure 2A:
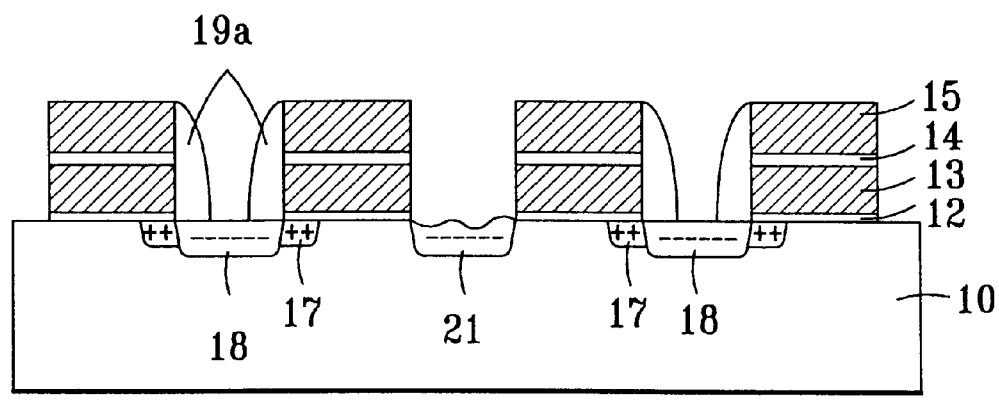
FIG. 2a is a sectional view showing a structure of the related art nonvolatile memory device taken along the line I—I in FIG. 1.
Figure 2B:
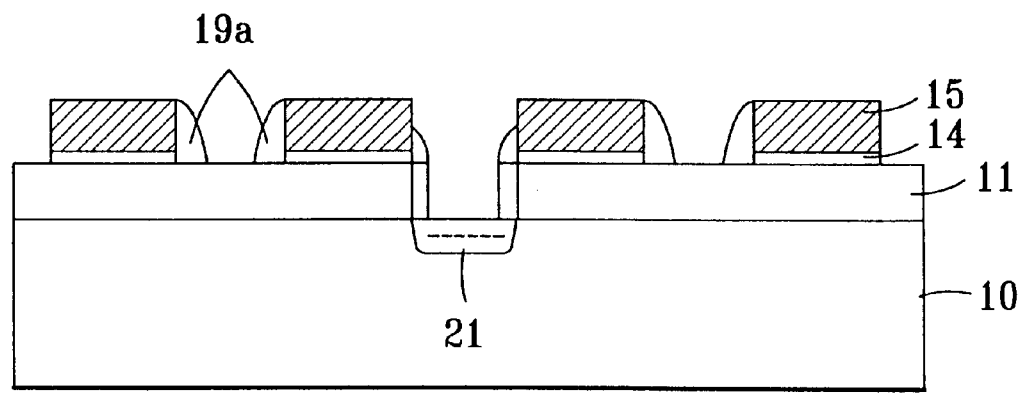
FIG. 2b is a sectional view showing a structure of the related art nonvolatile memory device taken along the line II—II in FIG. 1.
Figure 3A:
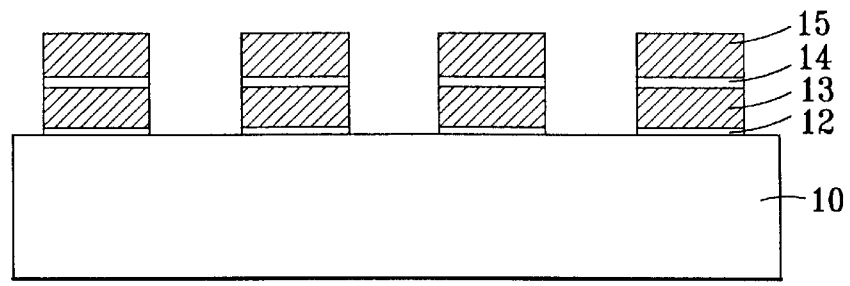
FIGS. 3a to 3f are sectional views showing the process for forming the related art nonvolatile memory device taken along the line I—I in FIG. 1.
Figure 3B:
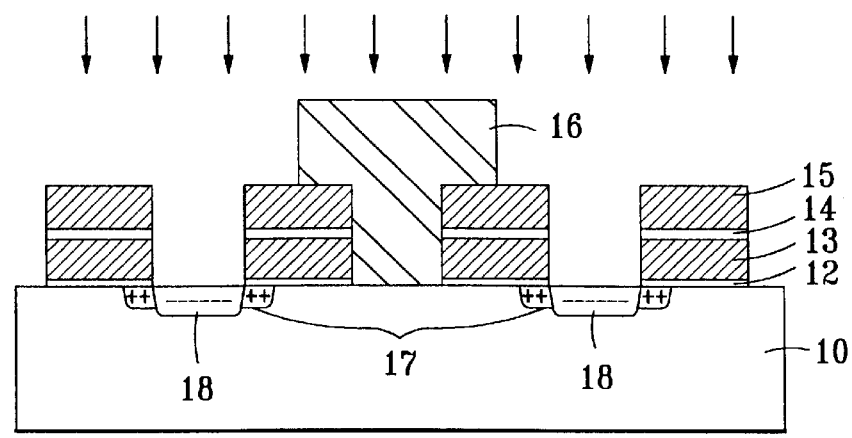
Figure 3C:
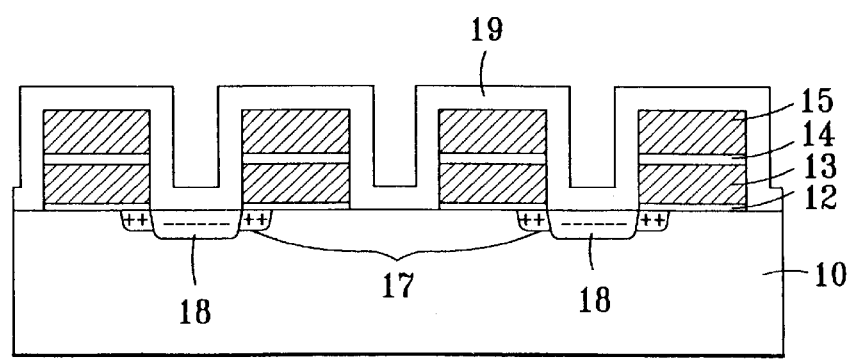
Figure 3D:
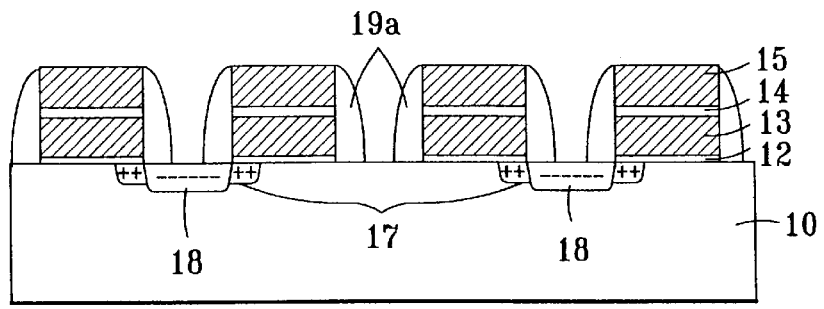
Figure 3E:
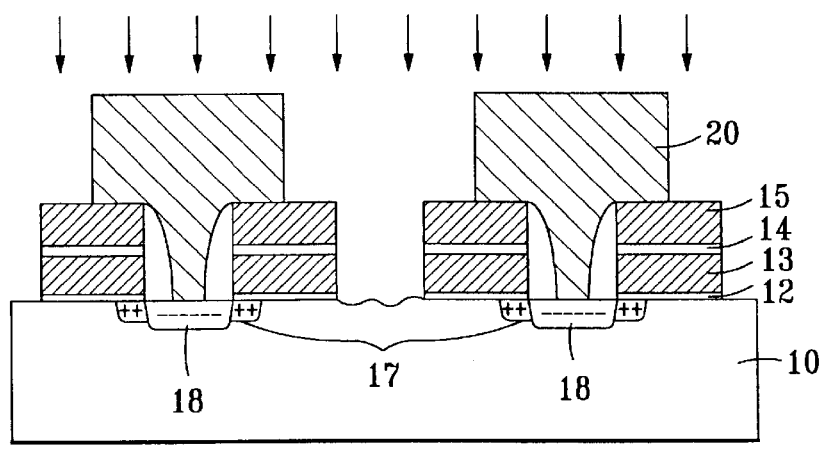
Figure 3F:
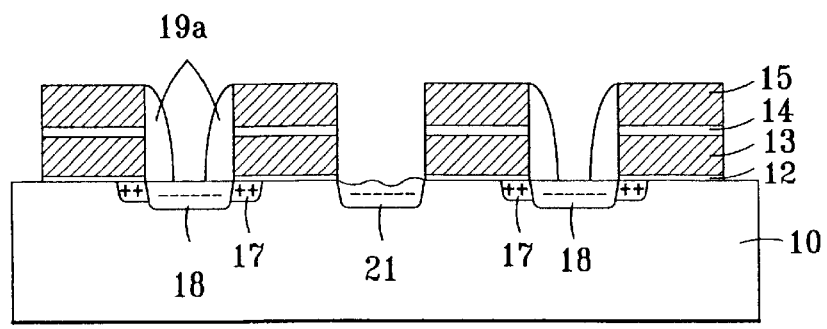
Figure 4A:
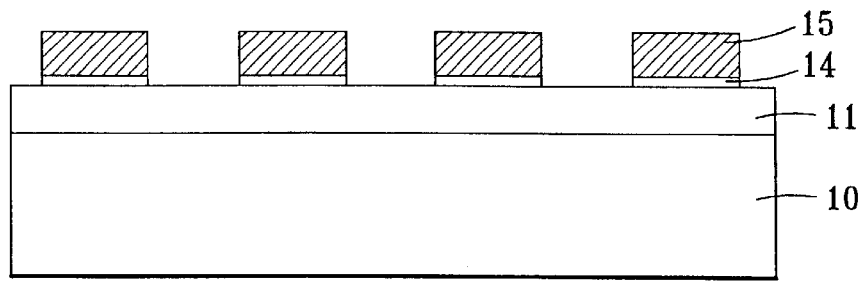
FIGS. 4a to 4f are sectional views showing the process for forming the related art nonvolatile memory device taken along the line II—II in FIG. 1.
Figure 4B:
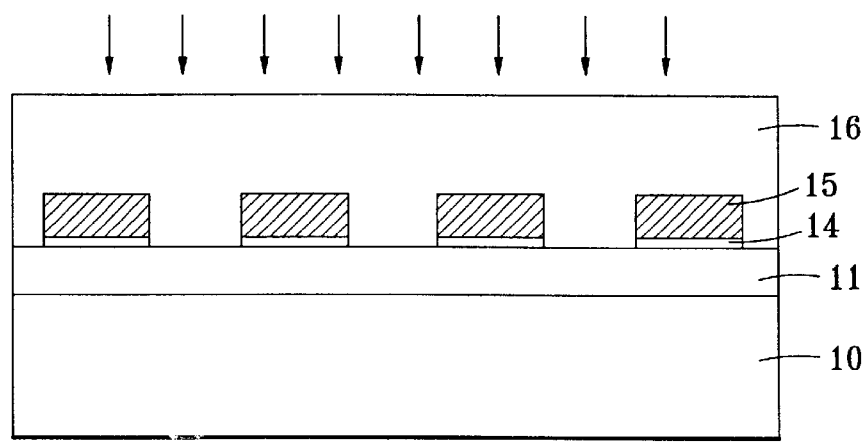
Figure 4C:
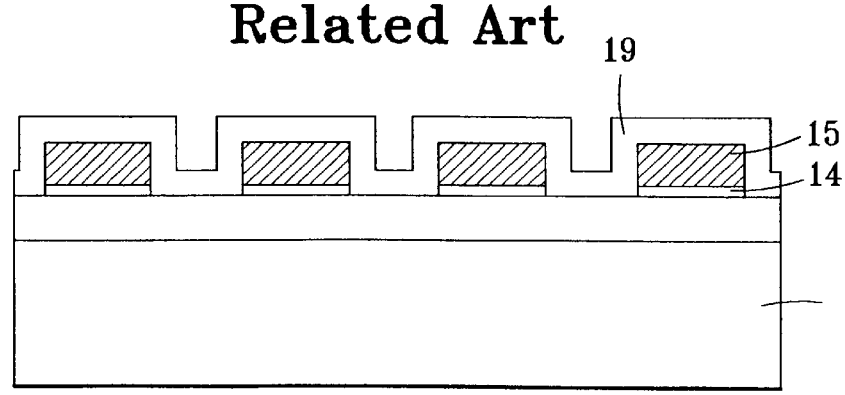
Figure 4D:
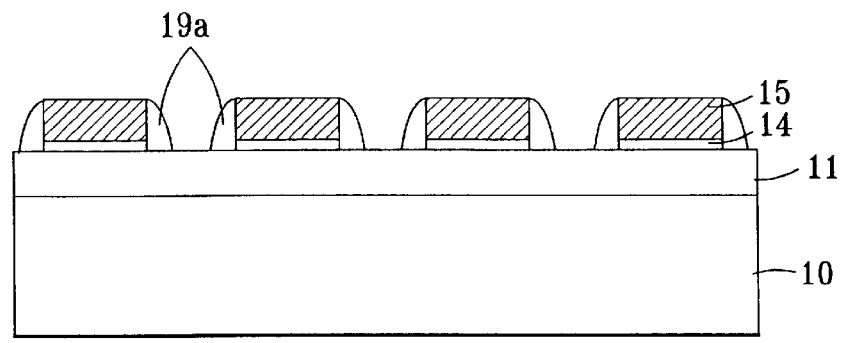
Figure 4E:
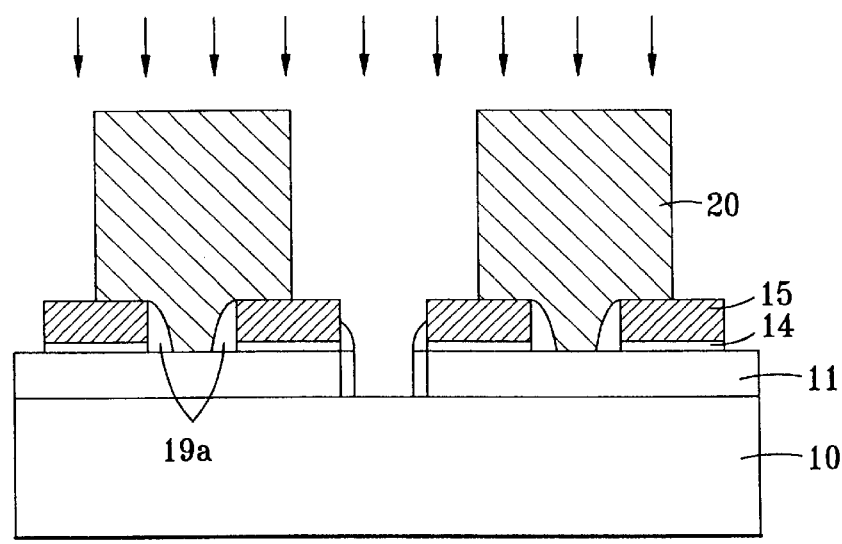
Figure 4F:
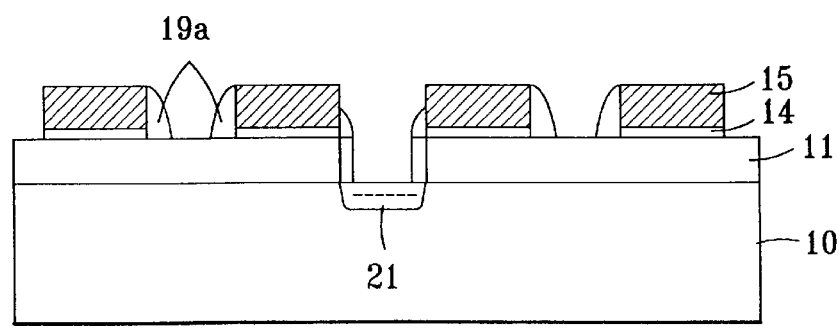
Figure 5:
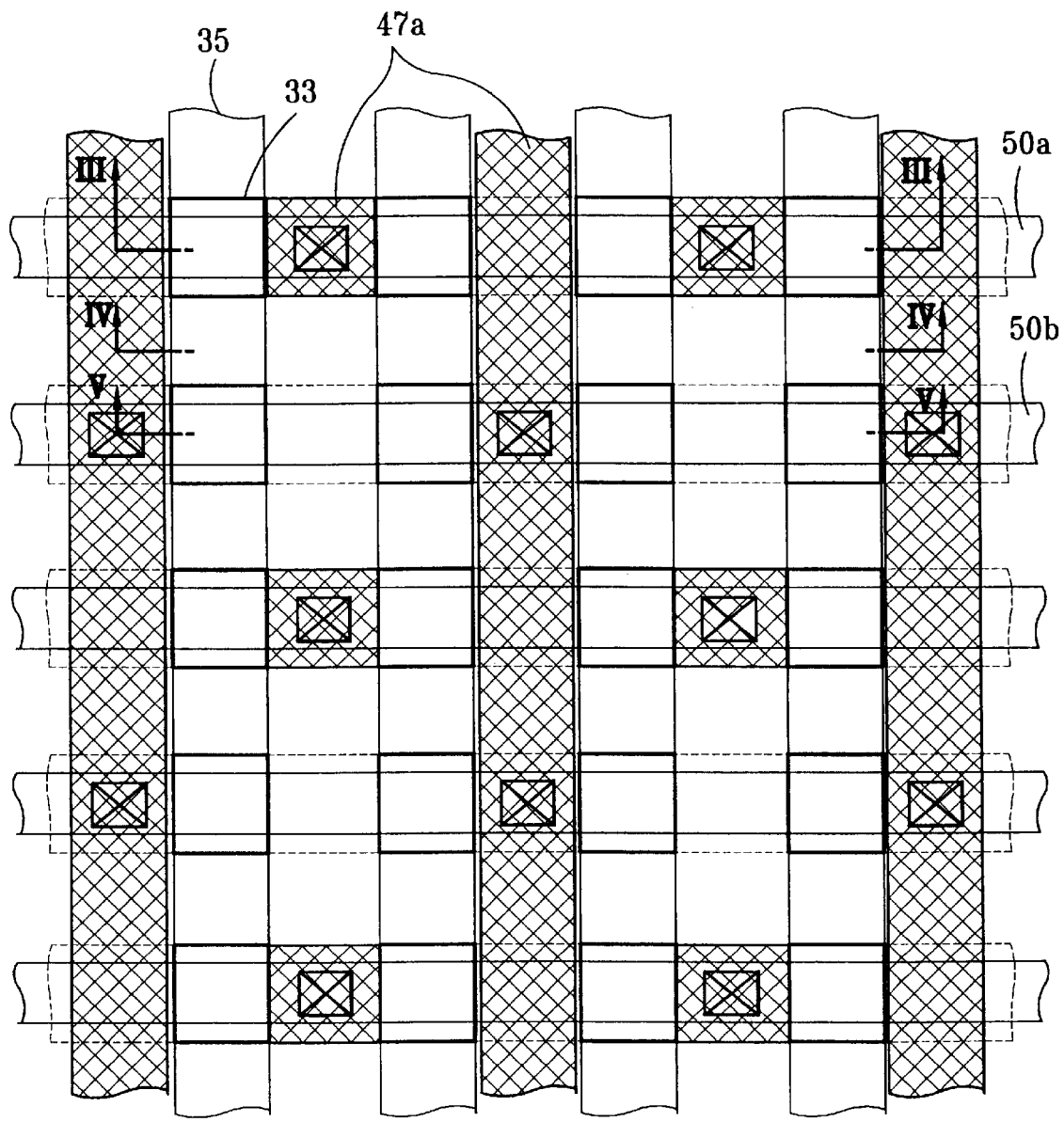
FIG. 5 is a plan view showing a cell array of a nonvolatile memory device in accordance with the present invention.
Figure 6A:
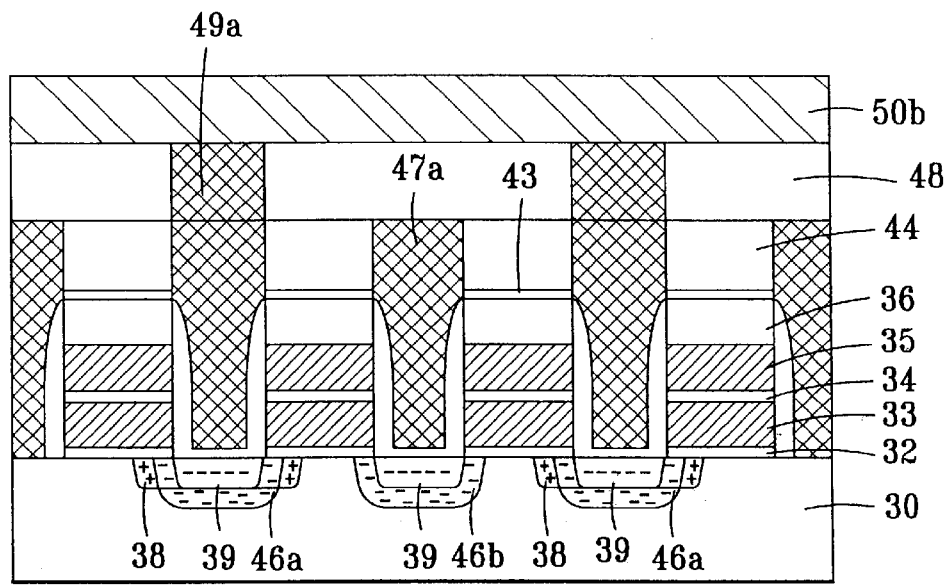
FIG. 6a is a sectional view showing a structure of the invented nonvolatile memory device taken along the line III—III in FIG. 5.
Figure 6B:
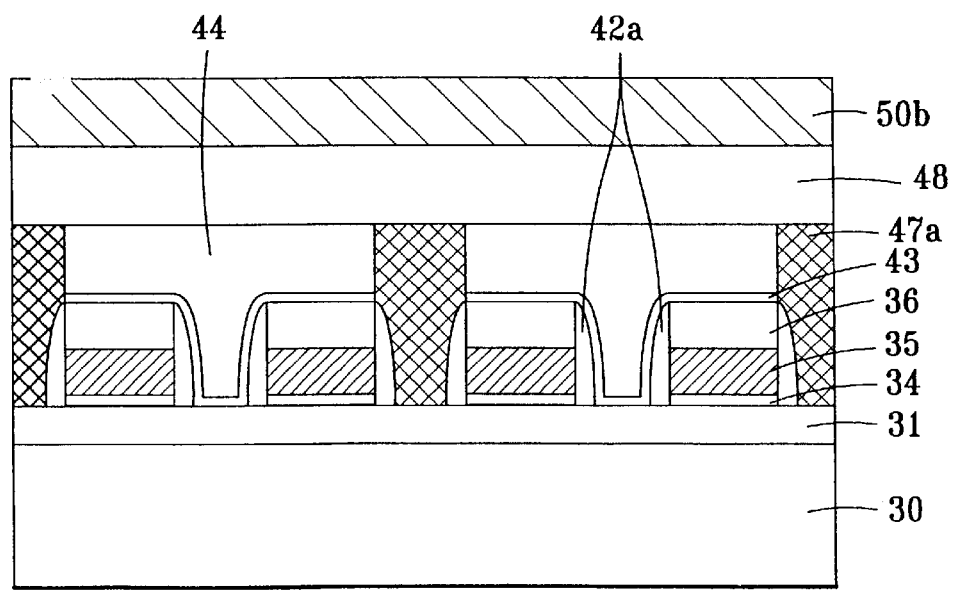
FIG. 6b is a sectional view showing a structure of the invented nonvolatile memory device taken along the line IV—IV in FIG. 5.
Figure 6C:
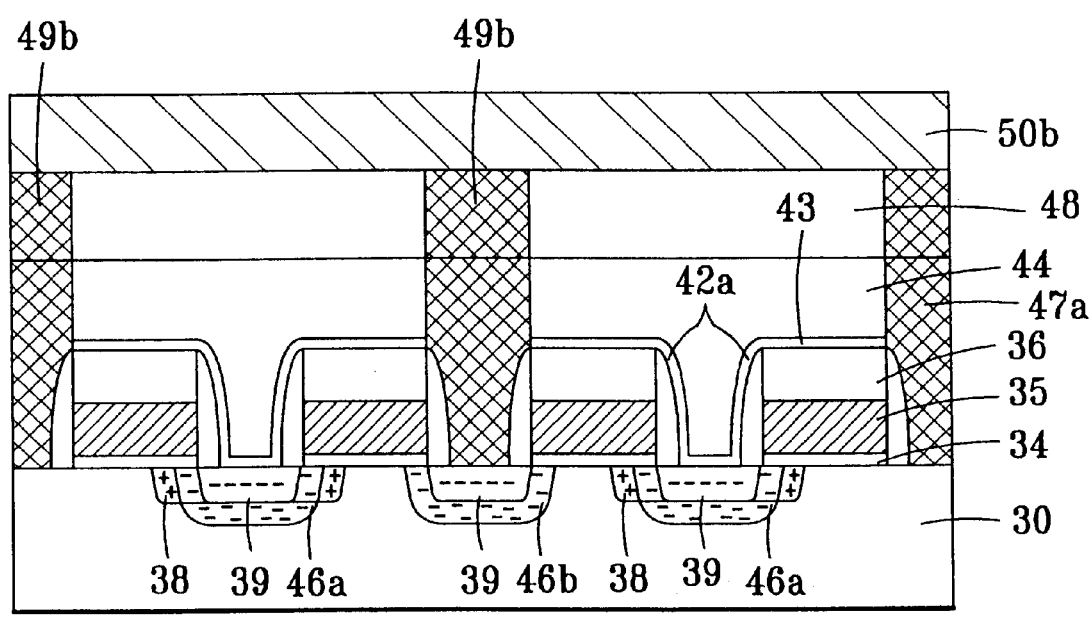
FIG. 6c is a sectional view showing a structure of the invented nonvolatile memory device taken along the line V—V in FIG. 5.

FIG. 5 is a plan view showing a cell array of a nonvolatile memory device in accordance with the present invention. FIG. 6a is a sectional view showing a structure of the invented nonvolatile memory device taken along the line III—III in FIG. 5, FIG. 6b is a sectional view showing a structure of the invented nonvolatile memory device taken along the line IV—IV in FIG. 5, and FIG. 6c is a sectional view showing a structure of the invented nonvolatile memory device taken along the line V—V in FIG. 5.

Referring to FIGS. 5 and 6a to 6c, a nonvolatile memory device of the present invention includes a semiconductor substrate 30 defining active regions and field region. A field oxide film 31 is formed on the field region. The plurality of active regions are aligned in one direction.

A plurality of tunneling oxide films 32 and floating gates 33 are deposited on the active regions in a predetermined pattern. A plurality of inter-poly-dielectric layers 34, control gate lines 35 and cap insulating layers 36 are deposited on the field oxide film 31 and the floating gates 33 in one direction perpendicular to the active regions.

A plurality of sidewalls 42a are formed at both sides of the tunneling oxide film 32, floating gate 33, inter-poly dielectric layer 34, control gate line 35 and cap insulating layer 36. A buffer nitride layer 43 is deposited on the cap insulating layer 36 at a thickness of 50~500 Å.

The control gate lines 35 are formed as a plurality of pairs each consisting of two, i.e., first and second control gate lines. The pair of control gate lines 35 lines will be explained below.

Drain regions are formed in the active regions outside a pair consisting of first and second control gate lines 35, and source regions are formed in the active regions between the first and second control gate lines 35.

Each of the drain regions includes a low concentration drain region 39 and a high concentration drain region 46a. The low concentration drain region 39 is formed in the semiconductor substrate 30 outside the pair of the first and second control gate lines 35 and under the sidewalls 42a. The high concentration drain region 46a is formed deeper than the low concentration drain region 39 and extended into a low portion of the semiconductor substrate 30 under the tunneling oxide film 32.

Low concentration halo ion regions 38 are formed at both sides of the low concentration drain region 39.

Each of the source regions includes a low concentration source region 41 and a high concentration source region 46b. The low concentration source region 41 is formed in the semiconductor substrate 30 between the first and second control gate lines 35. The high concentration source region 46b is formed deeper than the low concentration source region 41 and extended into a low portion of the semiconductor substrate 30 under the tunneling oxide film 32.

A first interlayer dielectric 44 is formed such that first contact holes are provided in each of the low concentration drain region 39 and that line-type contact holes are provided in one direction perpendicular to the active regions so as to expose the field oxide film 31 and the active regions (source regions) between the first and second control gate lines.

The first contact holes and line-type contact holes are formed by a self-align contact process using the sidewall 42a and the buffer nitride layer 43.

Tungsten plugs 47a are provided for burying each of the first contact holes and line-type contact holes of the first interlayer dielectric 44.

The tungsten plug 47a formed on the semiconductor substrate 30 (source regions and field oxide film 31) for connecting the low concentration source regions 41 between the first and second control gate lines is referred to as a common source line.

A second interlayer dielectric 48 is formed such that second contact holes are provided in the tungsten plugs 47a on the low concentration drain regions 39 in the first active region and that a third contact hole is provided in one portion of the common source line between the first and second control gate lines 35 in the second active region.

The second contact holes are provided with contact plugs 49a, and the third contact hole is provided with a contact plug 49b. Drain wires 50a are formed on the second interlayer dielectric 48 and on the contact plugs 49a in the second contact holes formed on a same active region, to be aligned with the active region. Source wires 50b are formed on the second interlayer dielectric 48 and on the contact plug 49b of the third contact hole, to be aligned with the active region. The drain wires 50a and the source wires 50b are formed on different active regions.

The above-explained nonvolatile memory device consists of two active regions; tunneling oxide film 32 and floating gate 33 deposited on the active regions in a predetermined pattern; inter-poly dielectric layer 34 and control gate line 35 deposited in a direction perpendicular to the active regions to cover the floating gate 33 of the active regions; drain regions formed in the active region at one side of the control gate line 35; source regions formed in the active region at the other side of the control gate line 35; and tungsten plugs 47a arranged in one direction at the other side of the control gate line 35 for connecting the source regions of the active region, and formed in the drain regions.

The tungsten plug 47a connecting the source regions in one direction is referred to as a common source line.

Fabricating method a nonvolatile memory device according to a preferred embodiment of the present invention will be described with reference to the attached drawings.

FIGS. 7a to 7i are sectional views showing the process for forming the invented nonvolatile memory device taken along the line III—III in FIG. 5. FIGS. 8a to 8i are sectional views showing the process for forming the invented nonvolatile memory device taken along the line IV—IV in FIG. 5.

Figure 7A:
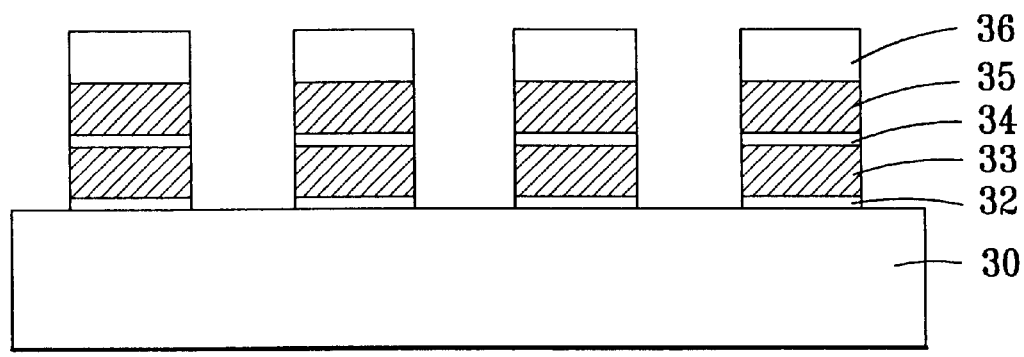
FIGS. 7a to 7i are sectional views showing the process for forming the invented nonvolatile memory device taken along the line III—III in FIG. 5.
Figure 8A:
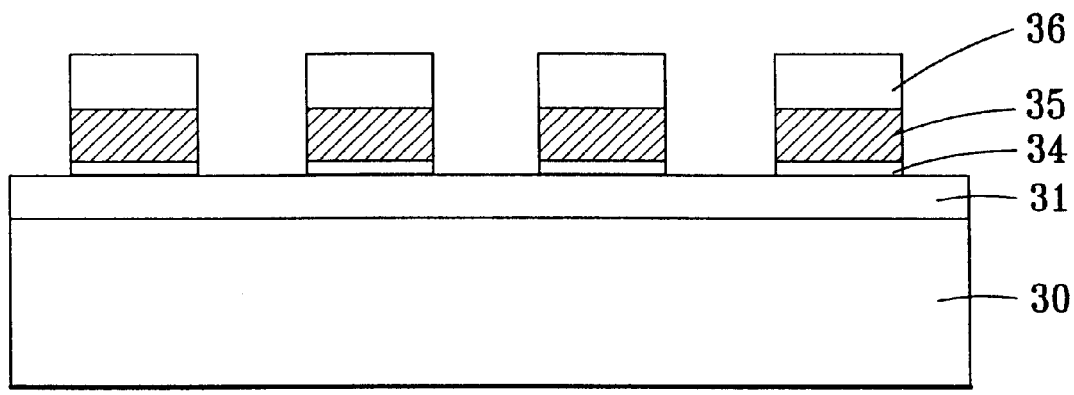
FIGS. 8a to 8i are sectional views showing the process for forming the invented nonvolatile memory device taken along the line IV—IV in FIG. 5.

Referring to FIGS. 7a and 8a, a field oxide film 31 is formed on the field region of the semiconductor substrate 30 defining a plurality of active regions and the field region. The active regions are arranged in one direction.

Then, although not shown in the Figures, using heat oxidation or chemical vapor deposition (CVD), a first oxide film is formed on the entire surface of the semiconductor substrate 30, and a first polysilicon layer is deposited on the first oxide film. A photo-sensitive film is coated on the first polysilicon layer, and then patterned to be parallel to and in line with the active regions. The first polysilicon layer and the first oxide film are successively anisotropic-etched using the patterned photo-sensitive film as a mask, to arrange the first polysilicon layer and the first oxide film in one line. Then, the photo-sensitive film is removed.

Also, although not shown in the Figures, a second oxide film, a second polysilicon layer and an oxide film(or nitride film) are successively deposited on the entire surface of the semiconductor substrate 30 using CVD. A photo-sensitive film is coated on the second polysilicon layer, and then patterned in one direction perpendicular to the active regions. The second polysilicon layer, the second oxide film, the first polysilicon layer and the first oxide film are successively anisotropic-etched, using the patterned photo-sensitive film as a mask.

By using the above-explained steps, a plurality of tunneling oxide films 32 and floating gates 33 are deposited on one portion of the active regions of the semiconductor substrate 30 in a predetermined pattern. A plurality of inter-poly dielectric layers 34, control gate lines 35 and cap insulating layers 36 are deposited in one direction perpendicular to the active regions to cover the floating gate 33. Then, the photo-sensitive film is removed.

Two, i.e., first and second control gate lines 35 forms a pair. The first and second control gate lines 35 share a source.

Figure 7B:
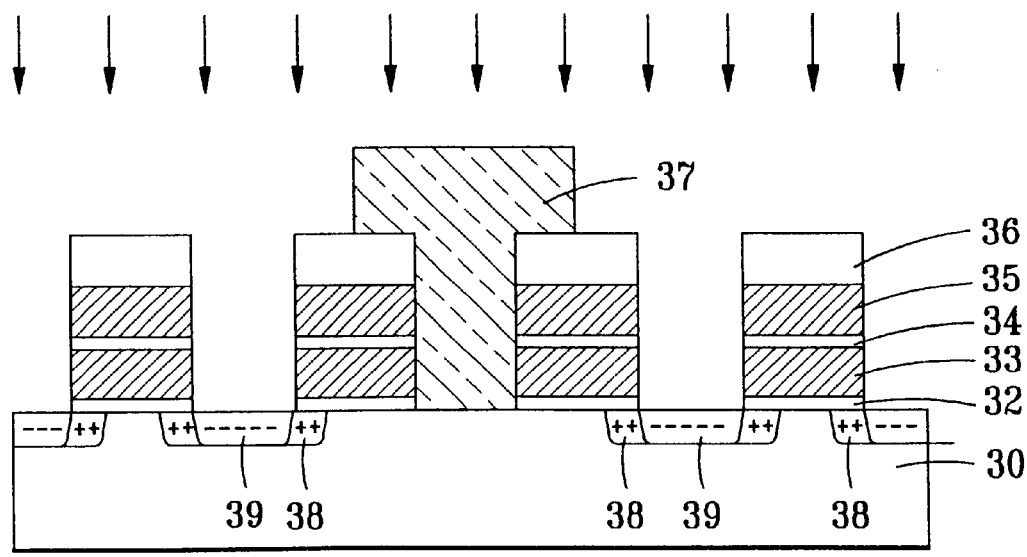
Figure 8B:
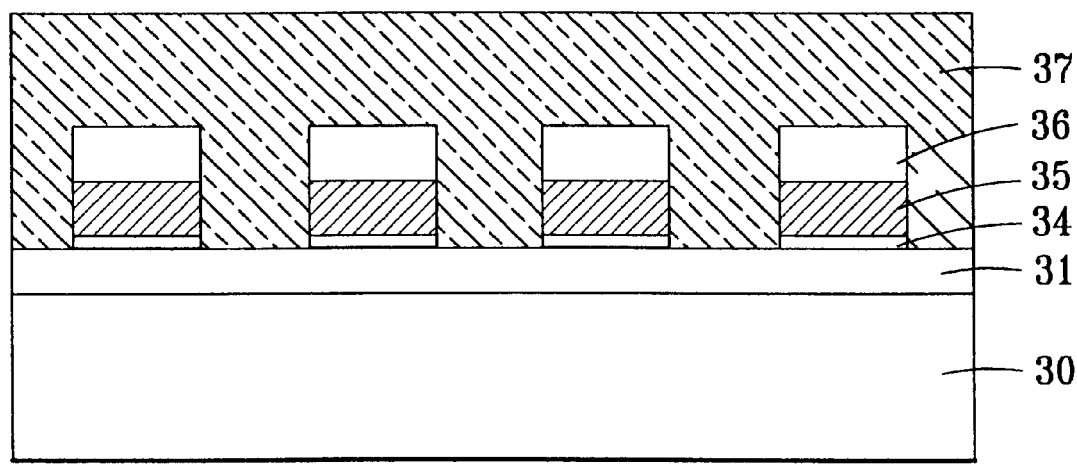

As shown in FIGS. 7b and 8b, the entire surface of the semiconductor substrate 30 is coated with a first photo-sensitive film 37. Then, the photo-sensitive film 37 is selectively patterned by exposing and developing process, so as to expose a portion of the active regions in the semiconductor substrate 30 in which drain regions are to be formed.

First conductive ions of low concentration are injected into the drain region of the semiconductor substrate 30, using the patterned first photo-sensitive film 37 as a mask, to form a low concentration drain region 39. By tilt ion injection method, second conductive ions are injected into one portion at the bottom of the floating gate 33 adjacent to the drain region to form a halo ion region 38. Then, the first photo-sensitive film 37 is removed.

Phosphor and boron ions are used as the first and second conductive ions, respectively, and each are injected at a concentration of $1E^{12} \sim 1E^{14}$. The second conductive ions are injected at an angle of 30~60 degrees.

Figure 7C:
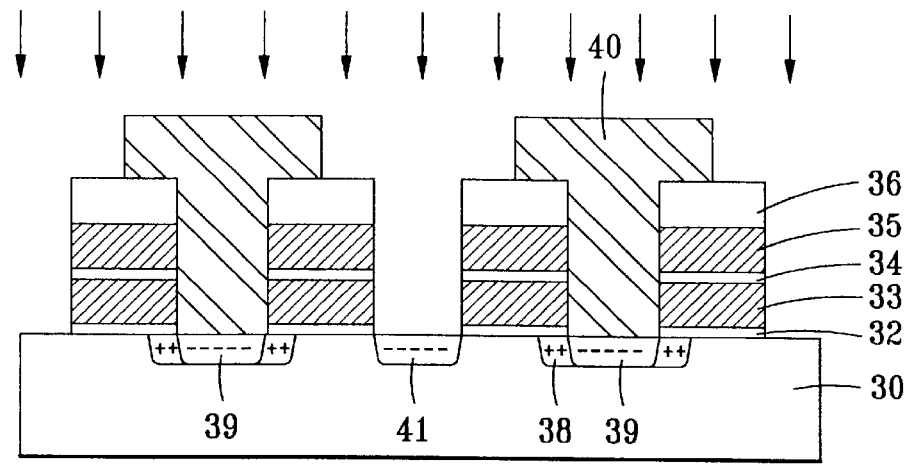
Figure 8C:
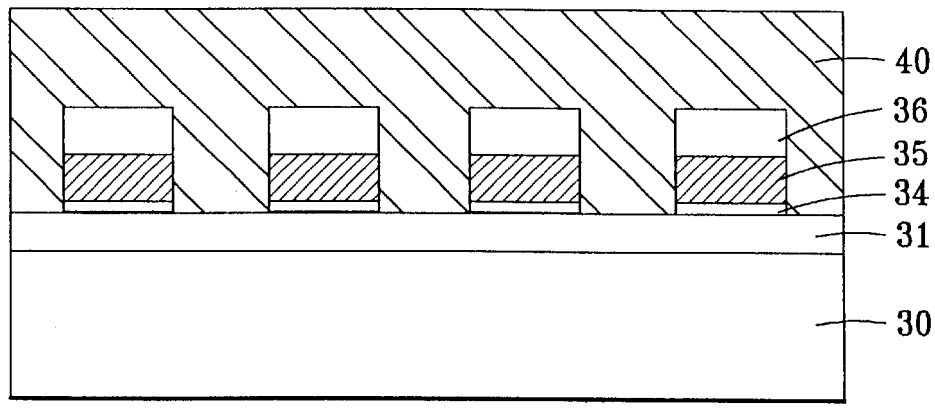

As shown in FIGS. 7c and 8c, the entire surface of the semiconductor substrate 30 is coated with a second photo-sensitive film 40. Then, the second photo-sensitive film 40 is selectively patterned by using exposing and developing process, so as to expose a portion of the active region in the semiconductor substrate 30 in which a source region is to be formed.

A first conductive ions of low concentration are injected into the source region in the semiconductor substrate 30, using the patterned second photo-sensitive film 40 as a mask, to form a low concentration source region 41. Then, the second photo-sensitive film 40 is removed.

Phosphor ions are used as the first conductive ions and injected at a concentration of $1E^{12} \sim 1E^{15}$.

Figure 7D:
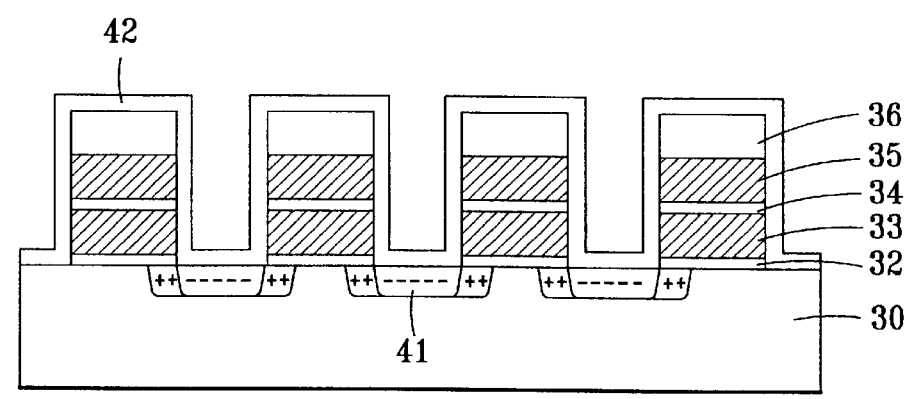
Figure 8D:
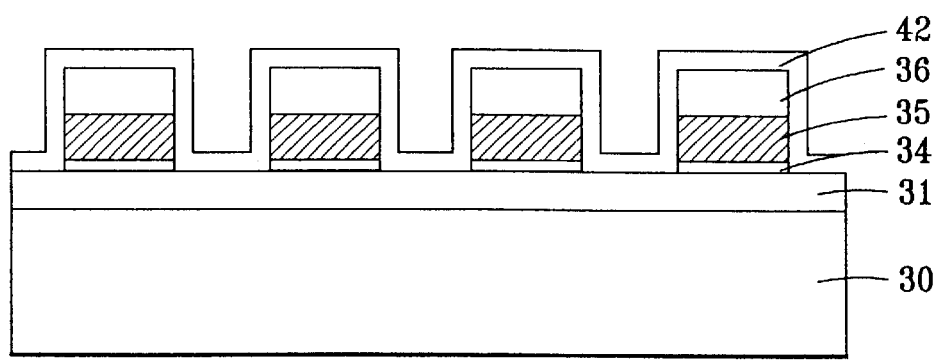

Referring to FIGS. 7d and 8d, an insulating layer 42 of oxide or nitride is deposited on the entire surface of the semiconductor substrate 30 using CVD. The deposited insulating layer 42 has a thickness of 1000~3000 Å.

Figure 7E:
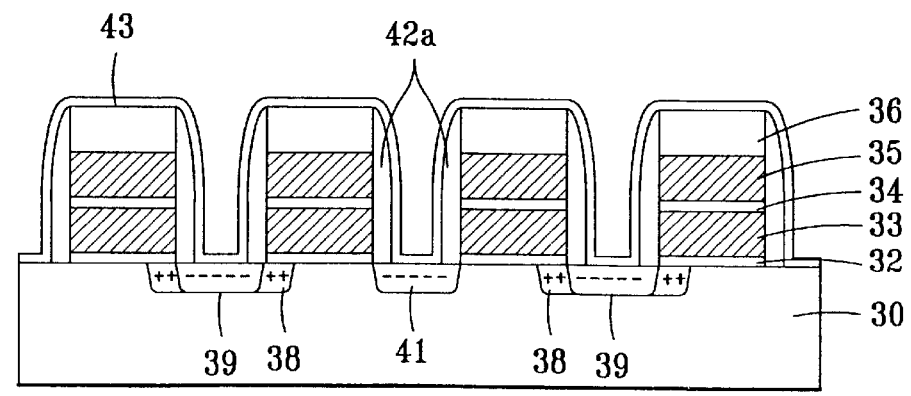
Figure 8E:
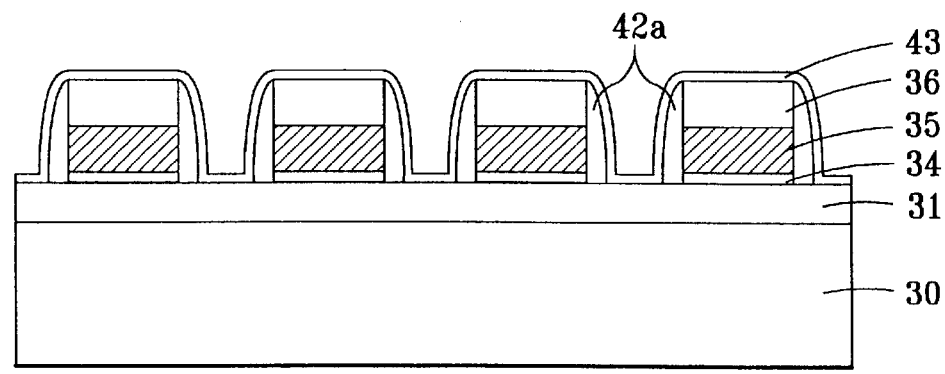

As shown in FIGS. 7e and 8e, the insulating layer 42 is anisotropic-etched to form sidewalls 42a at both sides of the tunneling oxide film 32, the floating gate 33, the inter-poly dielectric layer 34, the control gate line 35 and the cap insulating layer 36.

A buffer nitride film 43 of a thin thickness is deposited on the entire surface of the semiconductor substrate 30 including the low concentration source/drain regions 41 and 39, sidewalls 42a and cap insulating layer 36. The deposited buffer nitride film 43 has a thickness of 50~500 Å.

Figure 7F:
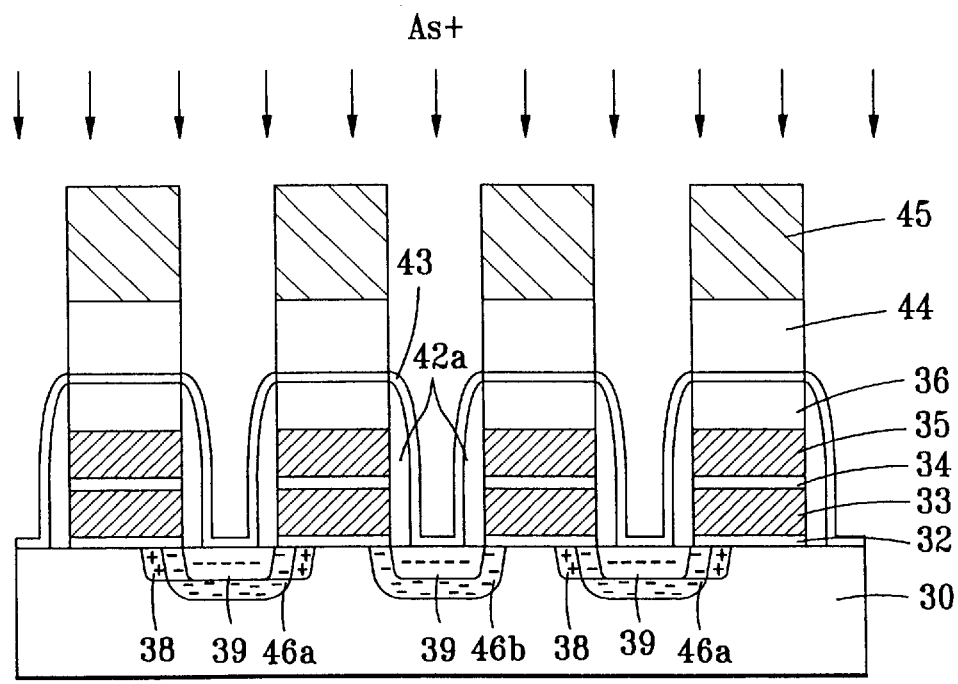
Figure 8F:
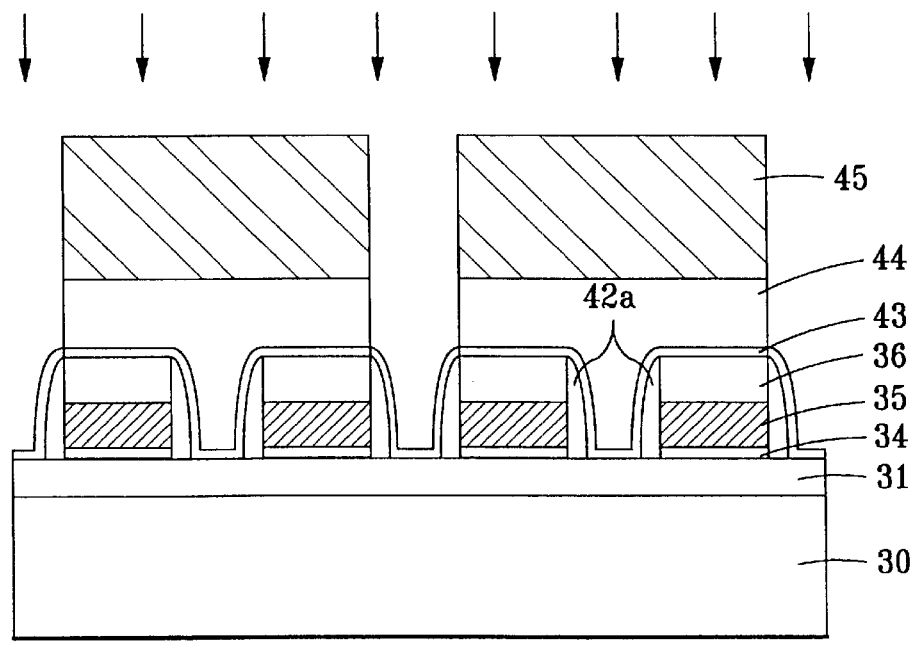

Referring to FIGS. 7f and 8f, a first interlayer dielectric 44 is deposited on the entire surface of the buffer nitride film 43 to have a thickness of 5000~10000 Å.

Then, chemical and mechanical polishing process, or etch-back process is used to flatten the first interlayer dielectric 44.

A third photo-sensitive film 45 is coated on the first interlayer dielectric 44 and selectively patterned by using exposing and developing process to expose the source and drain regions of the active regions.

The first interlayer dielectric 44 is anisotropic-etched using the patterned third photo-sensitive film 45 as a mask to form a first contact hole and a line-type contact hole in the drain and source regions, respectively.

In the formation of the line-type contact hole, the first interlayer dielectric 44 is removed so as to expose the field oxide film 31 and the low concentration source region 41 between the first and second control gate lines 35.

A high concentration drain region 46a and a high concentration source region 46b are formed by injecting first conductive ions of high concentration into the low concentration source/drain region 41 and 39 exposed by using the third photo-sensitive film 45 and the first interlayer dielectric 44.

As the first conductive ions, arsenic ions (As+) are injected at a concentration of $1E^{14} \sim 5E^{15}$ and at an angle of 30~60 degrees. Then, the third photo-sensitive film 45 is removed.

When forming the first contact hole and the line-type contact hole in the drain and source regions using the third photo-sensitive film 45, the buffer nitride film 43 acts as an etching stopper, which is referred to as a self-align contact process. Using the buffer nitride film 43 as an etching stopper prevents damage on the semiconductor substrate 30 in the contact process.

The buffer nitride film 43 may be removed after the formation of the first contact hole and the line-type contact hole in the drain and source regions, or after the formation of the high concentration drain region 46a and the high concentration source region 46b.

Figure 7G:
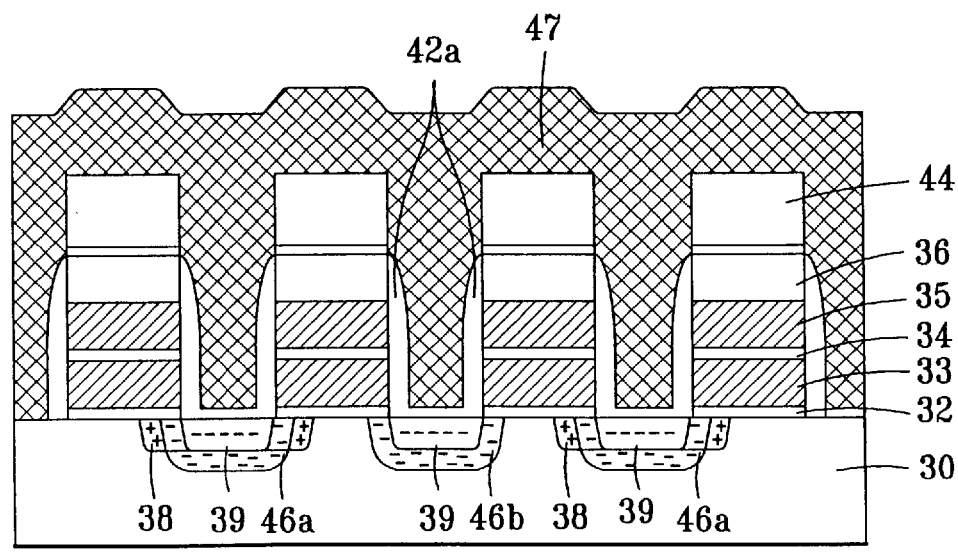
Figure 8G:
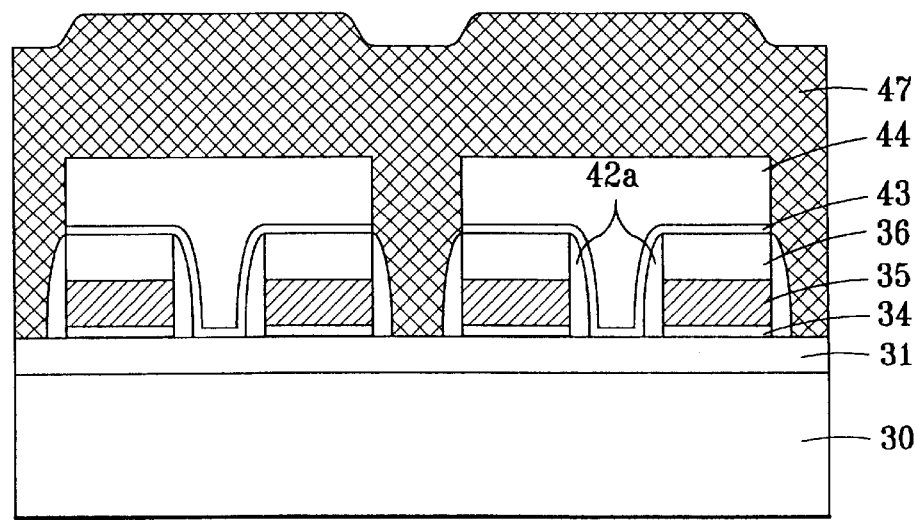

As shown in FIGS. 7g and 8g, a tungsten layer 47 is deposited on the entire surface of the semiconductor substrate 30 including the first contact hole and the line-type contact hole. The deposited tungsten layer 47 has a thickness of 5000~1000 Å.

Figure 7H:
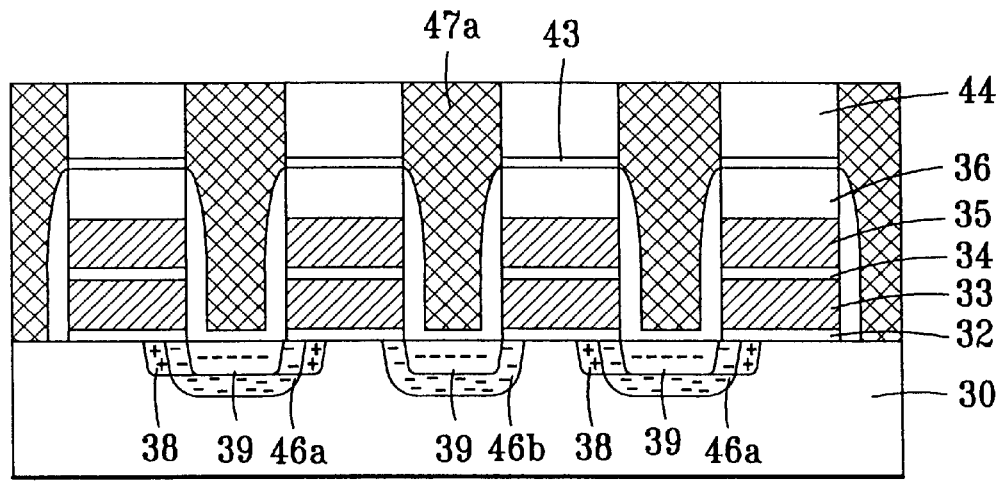
Figure 8H:
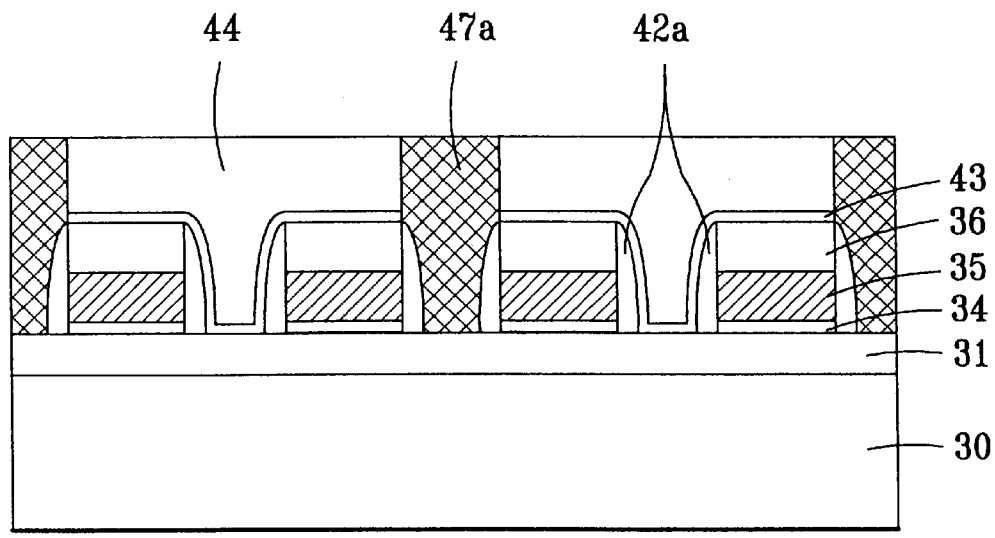
Figure 8I:
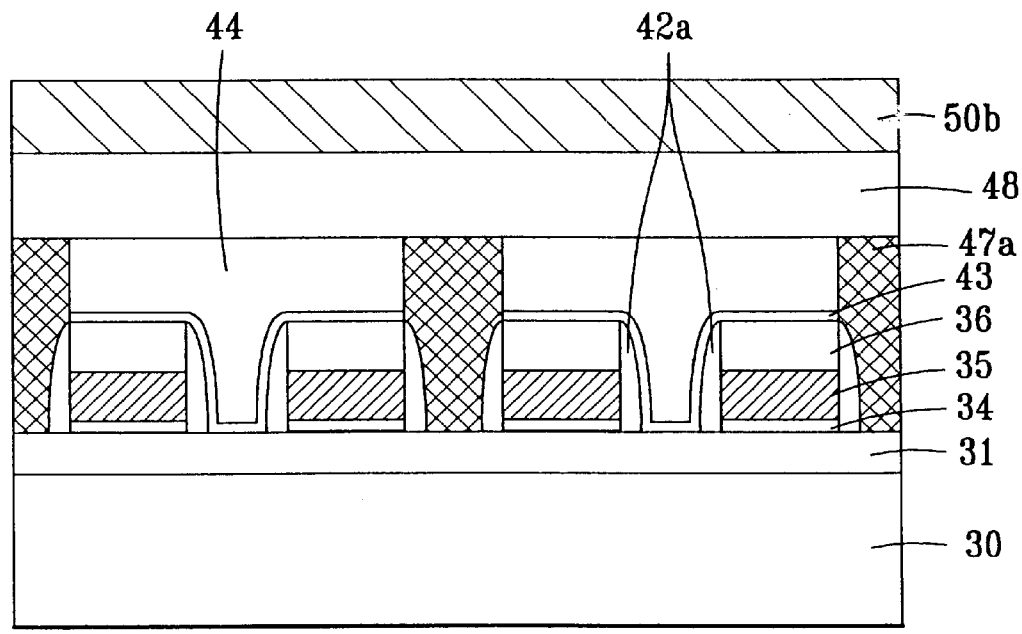

Referring to FIGS. 7h and 8h, the tungsten layer 47 is removed using chemical and mechanical polishing process or etch-back process until the first interlayer dielectric 44 is exposed, thereby forming tungsten plugs 47a in the first contact hole of the drain region and in the line-type contact hole of the source region.

The tungsten plugs 47a in the drain region are separated from each other. The tungsten plugs 47a in the source region are formed in one direction between the first and second control gate lines so as to connect the source regions of each active region between the first and second control gate lines. This is referred to as a common source line.

Figure 7I:
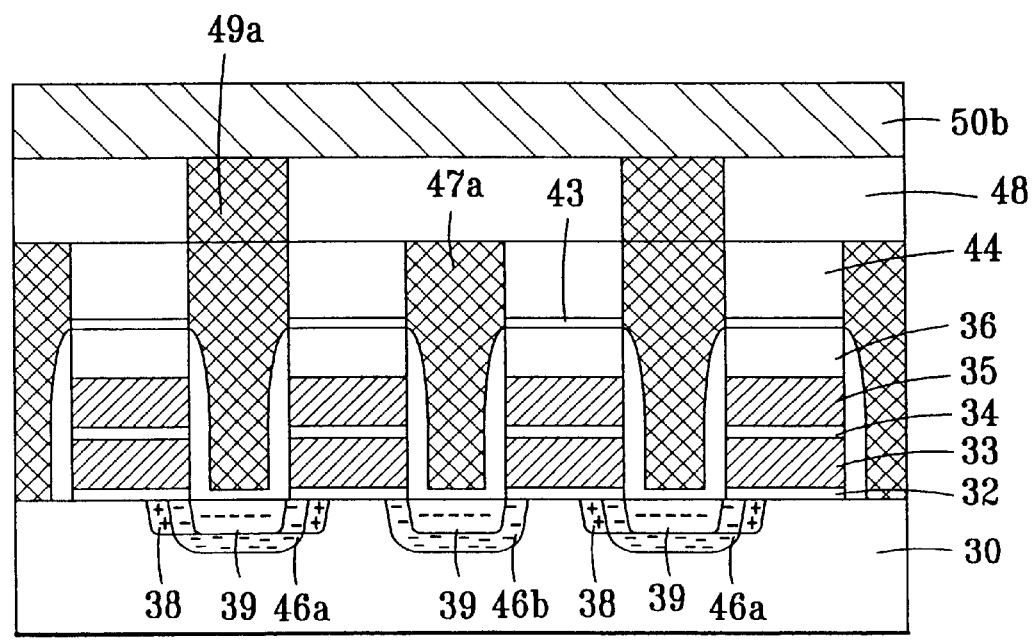

Referring to FIG. 7i, a second interlayer dielectric 48 is deposited on the tungsten plugs 47a and the first interlayer dielectric 44, and then anisotropic-etched to form second contact holes in the tungsten plugs 47a contacted with the drain region of the active regions and to form a third contact hole in the tungsten plugs 47a (i.e., the common source line) arranged in one direction in the source region of the active regions. The second contact holes and the third contact hole are formed on different portions of the active regions.

After contact plugs 49a and 49b are formed in the second and third contact hole, respectively, drain wires 50a are formed on the second interlayer dielectric 48 in parallel to the active regions, for connecting the contact plugs 49a formed in the drain region on a same active region.

Simultaneously with the formation of the drain wires 50a, source wires 50b are formed on the second interlayer dielectric 48 to be contacted with one portion of the contact plug 49b of the source region and to be arranged parallel to the active region.

The drain and source wires 50a and 50b are formed on different portions of the active regions.

As described, the nonvolatile memory device and the method for fabricating the same in accordance with the present invention has the following advantages.

First, since self-align contact process is used for forming a common source line, in application of a same deign rule, the size of unit cell of the nonvolatile memory device can be reduced by 70% compared with the related art device. Accordingly, integration of the device can be realized.

Second, by using a buffer nitride oxide film as an etching stopper during the self-align contact process, damage on the semiconductor substrate can be prevented. Accordingly, current leakage is suppressed and reliability on the operation of the device is improved.

Third, by using chemical and mechanical polishing, or etching back process for forming a common source line, i.e., tungsten plugs on the semiconductor substrate in one direction, self-align source dry-etching process for etching a field oxide film between the source regions is not necessary. Thus, simplification of the fabricating process is attained.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A nonvolatile memory device comprising:
    a semiconductor substrate defining first and second active regions arranged in one direction;
    a first gate insulating layer and a floating gate deposited on the first and second active regions in a predetermined pattern;
    a second gate insulating layer and a control gate line deposited in one direction perpendicular to the first and second active regions and covering the floating gate;
    a cap insulating layer on the control gate line;
    first impurity regions formed in the first and second active regions at one side of the control gate line;
    second impurity regions formed in the first and second active regions at other side of the control gate line;
    first contact plugs contacted with the first impurity regions; and
    a common conductive line formed in one direction on the semiconductor substrate at the other side of the control gate line, for connecting the second impurity regions of the first and second active regions.

2. The nonvolatile memory device as claimed in claim 1, wherein the common conductive line is formed in one direction on the second impurity regions of the first and second active regions and on a field oxide film between the second impurity regions.

3. The nonvolatile memory device as claimed in claim 1, further comprising sidewalls at both sides of the first gate insulating layer, the floating gate, the second gate insulating layer, and the control gate line.

4. The nonvolatile memory device as claimed in claim 1, further comprising:
    second contact plugs contacted with the first contact plugs;
    a third contact plug contacted with one portion of the common conductive line;
    first wires arranged in one direction, for connecting the second contact plugs; and
    second wires arranged in one direction and contacted with one portion of the third contact plug.

5. The nonvolatile memory device as claimed in claim 1, wherein the first impurity regions are drain regions and the second impurity regions are source regions.

6. The nonvolatile memory device as claimed in claim 1, wherein an additional control gate line is provided in one direction for sharing the second impurity regions of the first and second active regions.

7. A nonvolatile memory device comprising:
    a semiconductor substrate defining a plurality of active regions arranged in one direction;
    a plurality of first gate insulating layers and floating gates deposited on the active regions in a predetermined pattern;
    a plurality of pairs each consisting of two second gate insulating layers and a plurality of pairs each consisting of first and second control gate lines, deposited in one direction perpendicular to the active regions and covering the floating gates of the active regions;
    first impurity regions formed in the active regions outside the pair of the first and second control gate lines;
    second impurity regions formed in the active regions between the first and second control gate lines;
    first contact plugs contacted with the first impurity regions; and
    a plurality of common conductive lines formed in one direction on the semiconductor substrate between the first and second control gate lines, for connecting the second impurity regions between the first and second control gate lines.

8. The nonvolatile memory device as claimed in claim 7, wherein the common conductive lines are formed in one direction on the second impurity regions between the first and second control gate lines and on a field oxide film.

9. The nonvolatile memory device as claimed in claim 7, further comprising cap insulating layers formed on the control gate lines.

10. The nonvolatile device as claimed in claim 7, further comprising sidewalls at both sides of the first gate insulating layers, the floating gates, the second gate insulating layers, and the control gate lines.

11. The nonvolatile memory device as claimed in claim 7, further comprising:
    a plurality of second contact plugs contacted with the first contact plugs;
    a plurality of third contact plugs each contacted with one portion of each of the common conductive lines;
    first wires arranged in one direction, for connecting the second contact plugs on a same active region; and
    second wires arranged in one direction for connecting the third contact plugs.

* * * * *